(12) United States Patent
Pellegrini et al.

(10) Patent No.: US 6,700,950 B1
(45) Date of Patent: Mar. 2, 2004

(54) METHODS AND SYSTEMS FOR CONTROLLING CRITICAL DIMENSION (CD) ERROR

(75) Inventors: Joseph Pellegrini, Jamaica Plain, MA (US); David Crow, Maple Grove, MN (US)

(73) Assignee: Inficon LT Inc., Cambridge, MA (US)

( * ) Notice: Subject to any disclaimer, the term of this patent is extended or adjusted under 35 U.S.C. 154(b) by 0 days.

(21) Appl. No.: 10/284,757

(22) Filed: Oct. 31, 2002

(51) Int. Cl.⁷ .................................................. G21K 5/00
(52) U.S. Cl. ......................................... 378/34; 382/145
(58) Field of Search ...................... 378/34, 35; 430/4, 430/5; 382/144, 145

(56) References Cited

U.S. PATENT DOCUMENTS 6,429,930 B1 * 8/2002 Littau et al. ................. 356/124
6,526,164 B1 * 2/2003 Mansfield et al. ........... 382/144
2003/0138706 A1 * 7/2003 Progler et al. ................. 430/5

* cited by examiner

*Primary Examiner*—David V. Bruce
(74) *Attorney, Agent, or Firm*—Kevin A. Oliver; Foley Hoag LLP (57) ABSTRACT

Methods and systems for controlling critical dimension (CD) in a process system, including computing an exposure dose error based on at least one output of the process system, normalizing the computed exposure dose error based on a target exposure dose, and providing an exposure dose to the process system based on at least one normalized exposure dose error. The target exposure dose can be associated with a process system characteristic(s) and can be updated based on normalized computed exposure dose errors.

43 Claims, 5 Drawing Sheets

METHODS AND SYSTEMS FOR CONTROLLING CRITICAL DIMENSION (CD) ERROR

BACKGROUND

(1) Field

The disclosed methods and systems relate generally to control techniques, and more particularly to control systems for materials manufacturing processes such as semiconductor manufacturing processes.

(2) Description of Relevant Art

Lithography is a process used in semiconductor manufacturing to transfer a circuit pattern from a photomask or reticle to a semiconductor wafer, or more specifically, to transfer the photomask pattern to a layer of resist that has been deposited on the wafer surface, where the resist is sensitive to irradiation. Different types of lithography can be based on the wavelength of the radiation used to expose the resist. For example, photolithography, otherwise known as optical lithography, uses ultraviolet (UV) radiation and a corresponding UV-sensitive resist. Ion beam lithography uses a resist sensitive to an ion beam, electron beam lithography uses a resist film sensitive to a scanning beam of electrons to deposit energy therein, and X-ray lithography uses a resist sensitive to X-rays.

Photolithography employs a photomask that can be understood to be a quartz plate that is transparent to UV radiation and includes a master copy of an integrated circuit that is often a microscopic integrated circuit. The photomask can be used to block resist exposure to select areas using chrome opaque areas.

A stepper is a resist exposure tool used in many photolithography systems to expose part of the wafer or resist in a given exposure. Systems employing a stepper can require a "step-and-repeat" process to expose the entire wafer as desired. A scanner is another type of resist exposure tool used in photolithography systems to expose part of the wafer or resist in a given exposure. Systems employing a scanner can require a "step-and-scan" process to expose the entire wafer as desired. In the aforementioned systems, overlay can be understood as the superposition of the pattern on the mask to a reference pattern previously created on the wafer surface. Related to overlay is alignment, which can be understood to be including positioning, or aligning, the mask or reticle relative to markers or targets on the wafer, prior to the exposure. Accordingly, to achieve proper exposure, overlay and alignment, among other parameters, should be properly controlled.

The smallest transverse dimension of a developed photoresist can be known as the critical dimension (CD), depends on the exposure or photoresist exposure dose, which is a measure of the light absorbed by the photoresist. Accordingly, a proper exposure dose for a given pattern can include different exposure times for different substrates based on the substrate optical properties. For example, an exposure dose can be based on the photoresist layer thickness which can change during manufacture to alter the surface's optical properties, thereby influencing the amount of light coupled into the photoresist. The CD of the developed photoresist thus determines the CD of the patterned material, and changes in a substrate's optical properties can result in unacceptable variations during the manufacturing process.

As the demand for smaller yet more complicated integrated circuits (ICs) increases, there is a similarly increased level of integration and hence reduction in CD. Because lithography can occur repeatedly throughout IC fabrication, the CDs of the lines in the different patterns which are transferred should be precisely controlled throughout the fabrication process.

Techniques to control photoresist using a fixed exposure time employ calibration techniques using test wafers which are coated with photoresist and exposed with the pattern of interest using various exposure times and stepper focus conditions. These "send-ahead" wafers are examined to determine the resultant CDs in the photoresist and the optimal exposure and focus conditions for subsequent use on production wafers. Such a technique is an "open loop" process that does not account for changes in processes that may precede a lithography step. Further, such a technique introduces time delays in the manufacturing process.

SUMMARY

The disclosed methods and systems include a method for controlling critical dimension (CD) by controlling exposure dose error in a process system. The method comprises measuring a measured exposure dose error ("dose error") based on an output(s) of the process system, normalizing the measured dose error based on a target exposure dose ("target dose"), and, providing an exposure dose to the process system, where the exposure dose can be based on a normalized dose error(s) which may or may not include aforementioned measured dose error. The target dose can thus be associated with a process system characteristic(s) and/or at least one measurement system characteristic(s) that can include, for example, a photomask, an exposure tool, and/or a process level. The measured dose error can thus be provided to a database, table, etc., and otherwise stored and/or associated with a process system and/or measurement system characteristic such as a photomask, an exposure tool, and a process level. This database ("normalization table") can be queried using hierarchical wildcarding querying methods to provide a target dose for normalizing measured dose errors, to provide a target dose for normalizing actual doses from the process system, and to provide a target dose for converting a dose error to an exposure dose for input (e.g., control) to the process system.

The exposure dose provided to the process system can thus be based on a combination of normalized exposure dose errors, where such combination can include a weighted moving average of normalized exposure dose errors. The exposure dose can thus be based on such combination, which can be converted from a unitless (normalized) quantity to an exposure dose using a target exposure dose retrieved from the normalization table. The target exposure dose used to convert the normalized dose error can be the target exposure dose used to normalize the measured exposure dose error, or can be a different target exposure dose.

Accordingly, the methods include providing a database(s) and/or memory(s) and/or other means (e.g., "normalization table") to associate a normalized exposure dose error with a target exposure dose, and to update a target exposure dose using such normalized exposure dose error.

The methods can include computing an exposure dose error by measuring a critical dimension based on an output (s) of the process system. Accordingly, a CD error can be computed by comparing a measured CD with a target CD, where in one embodiment, the comparison can be a difference measure. Such CD error can be converted to an exposure dose error using a dose sensitivity, where such conversion can include a scaling.

The method also includes generating an ideal exposure dose error based on the normalized exposure dose error and an (actual) exposure dose previously provided to the process system, where the exposure dose provided to the process system can be based on such ideal exposure dose error(s). The exposure dose provided to the process system can be, for example, based on a combination of ideal exposure dose error(s), such as a weighted moving average of at least two ideal exposure dose errors.

Accordingly, the normalization table's target exposure doses can be based on a target critical dimension, a manually entered exposure dose, a focus and exposure matrix (FEM) associated with the process system, and/or at least one normalized measured exposure dose error. Accordingly, the database and/or table can have access to learning modules, filters, averaging techniques, etc., to determine, compute, update, or otherwise provide updated target exposure doses and associate such updated target doses with a process system and/or measurement characteristic. The updated target exposure doses can be based one or more normalized exposure dose errors, which may be associated with the same process system and/or measurement system characteristic as the target exposure dose for which the normalized exposure dose error(s) is updating. The methods can thus include providing one or more default and/or initial target exposure doses (referred to herein collectively as "default target doses") and associating such default target doses with one or more process system and/or measurement system characteristics, where such default target exposure doses can be updated based on the aforementioned filters, averaging techniques, and/or learning modules, using for example, normalized exposure dose errors, to provide an updated target exposure dose. The updated target exposure dose can thus be provided in response to a query of the normalization table.

Also disclosed are systems for controlling critical dimension (CD) in a process system, the system comprising a measurement system to provide a measurement(s) associated with a process system error(s), and, a control system to provide an exposure dose to the process system, where the exposure dose can be based on a normalized exposure dose error(s), where the normalized exposure dose error can be based on a target exposure dose associated with a process system characteristic(s) and/or a measurement system characteristic(s). The system can also include a normalization table to associate the target exposure dose with a process system characteristic(s) and/or a measurement system characteristic(s). Such characteristics can include, for example, a photomask, an exposure tool, and/or a process level.

The systems can thus include one or more processors with instructions to cause the processor(s) to compute a critical dimension (CD) error based on an output(s) of the process system. The CD error can be based on a comparison of a measured CD and a target CD, where the measured CD can be based on the output(s) of the process system. The control system can also include instructions to cause a processor to normalize a computed critical dimension (CD) error based on a target exposure dose, where the target exposure dose can be based on a manual entry(s), a normalized exposure dose error(s), and/or data based on a focus and exposure matrix(s) (FEM). Accordingly, the disclosed systems include instructions to cause a processor to retrieve the target exposure dose based on a query of a normalization table, where the normalization table associates the target exposure dose with a process system characteristic(s) and/or a measurement system characteristic(s).

The measurement system can be an exposure tool and/or a critical dimension measurement tool. The process system can include a lithography, a microlithography, a chemical mechanical polish (CMP), a diffusion, thin film, a metal deposition, an ion implantation, and/or an etching system.

The disclosed systems can include instructions to cause a processor to update a target exposure dose using at least one normalized exposure dose error, where the updated target exposure dose can be stored in the normalization table. The target dose can thus be updated using instructions that implement a learning module(s), a filter(s), and an averaging module(s). The updated target dose can thus be used for future normalizations of CD error(s).

Other objects and advantages will become apparent hereinafter in view of the specification and drawings.

DESCRIPTION

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed systems or methods. Additionally, the shapes and sizes of components are also exemplary and unless otherwise specified, can be altered without affecting the disclosed systems or methods.

For the disclosed methods and systems, references to a reticle can include a mask and a photomask, and variations thereof. Further, references to a database can be understood to be a memory that can be capable of associating memory elements.

The disclosed methods and systems relate to controlling critical dimension (CD) error by providing a process system with exposure dose data based on normalized exposure dose error(s). The exposure dose error can be normalized relative to, for example, a target exposure dose that can be associated with process system and/or measurement system characteristics such as, for example, a photomask and exposure tool, and the target exposure dose can be provided by a user, updated automatically through test data (e.g., normalized exposure dose errors), and/or generated based on FEM (Focus and Exposure Matrix) data and/or analysis. By normalizing exposure dose error based on a target exposure dose, the disclosed methods and systems can provide a process system with an exposure dose that controls critical dimension error.

Figure 1:
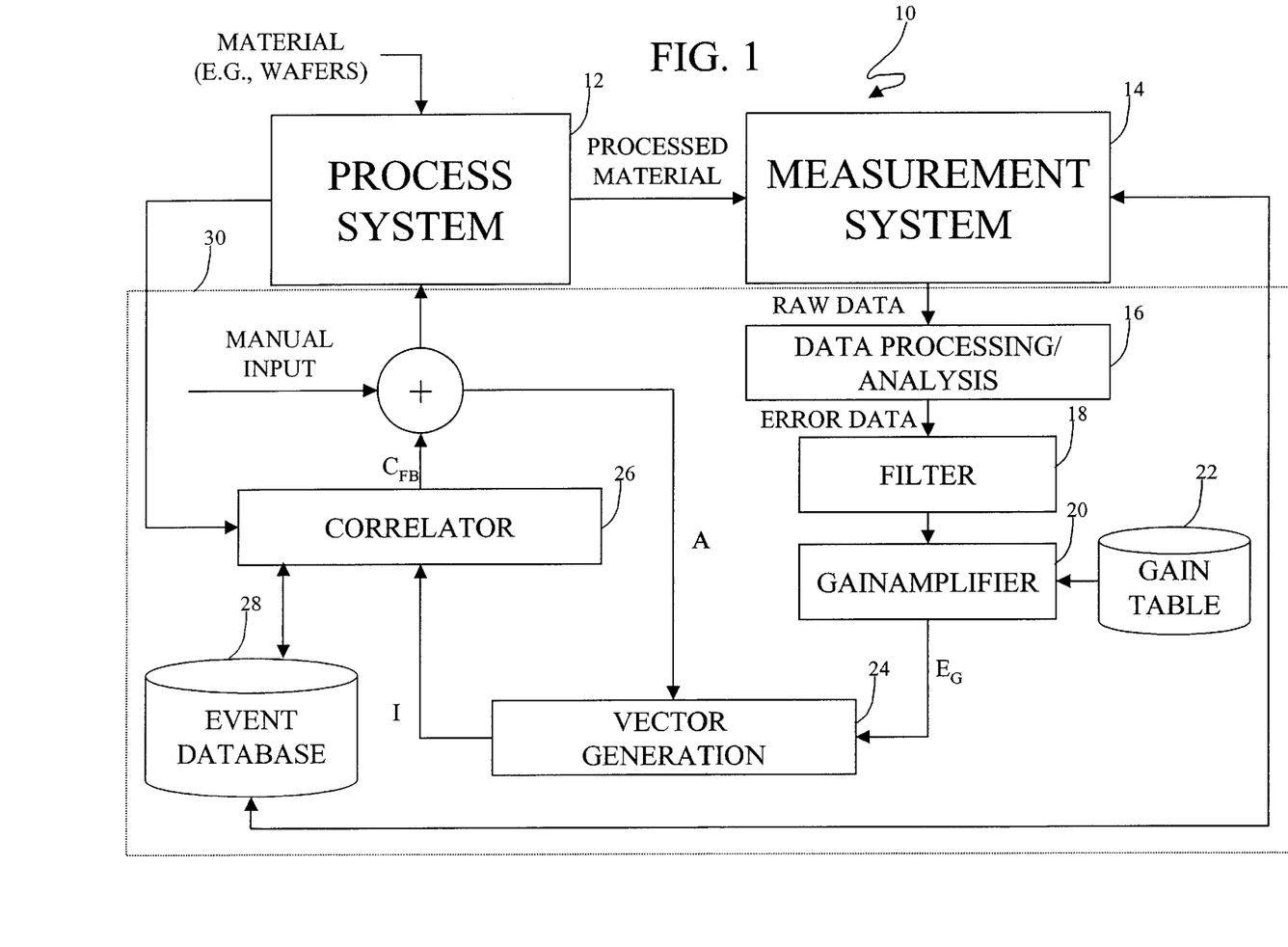
FIG. 1 illustrates a control system using feedback.

FIG. 1 provides one illustrative depiction of a control system 10 that can be associated with semiconductor manufacturing. In accordance with FIG. 1, materials such as semiconductor wafers can be input to a process system 12 and hence to a measurement system 14. The illustrated process system 12 can be, for example, a system that performs lithography, chemical mechanical polish (CMP), diffusion, thin film, metal deposition, ion implantation, etching, or another process system. The illustrated measurement system 14 can be, for example, a metrology system such as an exposure measurement system or tool, an overlay measurement tool, a critical dimension (CD) measurement tool, a thickness measurement tool, a film reflectivity measurement tool, or another measurement tool or system. Accordingly, for one such embodiment based on FIG. 1, semiconductor wafers can be presented to a photolithography system 12 and thereafter to an exposure measurement and/or critical dimension measurement tool 14 that provides measurements based on the processed wafers.

As shown in FIG. 1, raw data from the measurement system 14 can be provided for processing and/or analysis 16, where the raw data can include measurements from the measurement system 14, configuration data (e.g., component identifiers, system identifiers, etc.) based on the process system 12 and/or the measurement system 14, and other data (e.g., date, time, etc.). For a system according to FIG. 1, a data processing/analysis module 16 can be based on the process system 12 such that the output of the data processing/analysis module 16 can be configured to provide data in a form that can be used by and/or is otherwise compatible with the process system 12. In some systems, for example, the data processing/analysis module 16 can include modules for modeling and/or otherwise estimating at least some components and/or processes of the process system 12. In an illustrative embodiment where the process system 12 can be a lithography system and the measurement system 14 can be an exposure and/or critical dimension measurement system, the data processing/analysis module 16 can include, for example, least square regression models for components of the lithography system 12. On such component can measure and/or model, for example, critical dimension (CD). Those with ordinary skill in the art will recognize that such models and/or estimation modules are not limited to least square regression models, and other estimation and/or modeling techniques can be used without departing from the scope of the disclosed methods and systems.

In the illustrated embodiments, the data processing/analysis module 16 can provide error signals and/or data as output. Accordingly, in an embodiment based on the aforementioned lithography system, the data processing/analysis module 16 can provide data that can include measured CD, for example, but may additionally and optionally include other data such as x-translation, y-translation, x-scaling, y-scaling, wafer rotation, grid non-orthogonality, reticle magnification, reticle rotation, and/or others, where those of ordinary skill in the art will recognize that such data signals are merely for illustration and not limitation, and some embodiments may include fewer and/or more data, where the data can be in either analog and/or digital form. Unless otherwise provided herein, the data throughout the disclosed embodiments and the disclosed methods and systems can be understood to be in either digital or analog form without departing from the scope of the disclosed methods and systems.

Although the data processing/analysis module 16 is not limited to providing measurement and/or error data as output, for the discussion herein, such module's output can be referred to collectively as error data, where such error data can also include data based on the configuration of the process system 12 and/or the measurement system 14, and/or other data. To facilitate an understanding of systems and methods according to FIG. 1, the error data can be understood in some embodiments to include an error vector that can have at least one row and at least one column, where the size of the error vector can be based on the process system 12 and/or the measurement system 14. For the purposes of discussion herein, one of ordinary skill will also understand that one element of such an error vector can include an exposure dose error that can be computed, for example, according to Equation (1):

$$\text{Dose error} = (\text{Measured\_CD} - \text{Target\_CD})/(\text{DoseSensitivity}) \quad (1)$$

Systems and methods according to FIG. 1 can also include a filter 18 that can operate on data based on the data processing/analysis output, and filter such data based on fixed and/or variable criteria. A system administrator, user, or another can establish-or otherwise provide the filter criteria. In one illustrative system, the filter 18 can be based on user-defined rules that can qualify the filter input data to determine whether such filter input data should be employed for controlling and/or otherwise characterizing the process system 12. The filter 18 may be viewed as providing a condition for utilizing the input data to characterize the process system 12. For example, the filter 18 can distinguish data based on a number of successfully measured raw data points provided by the measurement system 14, where the number can be user-specified in some embodiments. In one embodiment, if a specified number of successfully measured raw data points are not provided, the data can be distinguished as inappropriate for feedback to the process system 12 in accordance with a system based on FIG. 1. Additionally and/or optionally, the filter 18 can route or otherwise distinguish or classify data based on data markers, flags, or other data that can indicate that the data input to the filter 18 can be ignored or may otherwise be inappropriate for feedback to the process system 12. In one example, the error data can be marked or otherwise designated as being associated with a special event. In some embodiments, the filter 18 can include validation rules that can be applied to the data input to the filter 18. In illustrative systems, the filter 18 can include statistical and/or other filtering techniques that can include, for example, classification techniques such as Bayesian classifiers and neural networks.

Systems and methods according to FIG. 1 can also include a gain amplifier 20 that can be a variable gain amplifier. A gain table 22 can accordingly provide stored gain values that adjust data based on the filtered error vector to compensate for scaling, sign differences, and other process system 12 and/or measurement system 14 characteristics. A gain amplifier output, Eg, can be provided to a vector generation module 24 that can provide a difference between: (a) data representing actual control data (offsets, commands, etc.), A, provided to the process system 12; and, (b) the gain amplifier output, Eg. The difference vector I=A−Eg, can be understood to represent an actual control to the process system 12, less the errors generated by such control. Those of ordinary skill in the art will recognize that the delay in providing the actual control, A, and receiving the error vectors, Eg, can be on the order of seconds, minutes, hours, or days.

Data based on the difference vector I can be provided to a correlator module 26 that identifies and processes data from events having similar process system 12 characteristics. For example, for a given process system 12, events having similar characteristics can include events that are processed using similar configurations of the process system 12 and/or measurement system 14. In an embodiment where the process system 12 can be a lithography system and the measurement system 14 can be an exposure and/or critical dimension measurement system, for example, characteristics can include a lithography system identifier, a reticle identifier, a routing identifier (e.g., material used in processing), an operation identifier (e.g., operation being performed), a process level identifier (e.g., stage of processing), an exposure tool identifier, and/or a part number, although such examples are provided for illustration and not limitation, and fewer and/or more system characteristics can be used to characterize an event. An event database 28 or other memory component can thus include historical measurement data that can be provided by the measurement process 14 and thereafter be accessed by or otherwise integrated with the correlator module 26 to allow a feedback control and/or command vector, $C_{FB}$, to be computed based on a historical evaluation of similar process system 12 and/or measurement system 14 configurations. In some embodiments, $C_{FB}$ can provide incremental control/commands to the process system 12, while in some embodiments, $C_{FB}$ can provide an absolute control/command to the process system 12. Those of ordinary skill in the art will recognize that in the illustrated embodiment, the dimension of $C_{FB}$ can be based on or be the same as Eg, as the commands provided by $C_{FB}$ can be associated with the process system components for which error data can be obtained.

In some embodiments, event database data can be associated and/or correlated to facilitate queries of the event database 28. In the illustrated system, the event database 28 can associate actual command data, A, and gain amplifier outputs, Eg, with "correlation keys" that represent process system characteristics, and can otherwise be understood to be query and/or index terms. Accordingly, as shown in FIG. 1, the correlator module 26 can provide a command vector, $C_{FB}$, to the process system 12, where $C_{FB}$ can be based on a query of the event database 28 and associated I vector data that can be based on the query. The event database query can otherwise be understood to be a "feedback request," and as provided herein, can be based on correlation keys or process system characteristics.

One of ordinary skill will recognize that although not explicitly indicated in the illustrated embodiments, the event database 28 can include actual command data A, and gain amplifier outputs Eg that may otherwise be understood as errors. Accordingly, an ideal vector, or difference vector, I, can be recreated from respective A and Eg data.

In one embodiment, the command vector, $C_{FB}$, can be based on a weighted moving average of historical difference vectors (e.g., "I vectors") that can be further based on similar process system characteristics and included in the event database 28. The weighted moving average can also be based on a user-specified time-period that can specify a time over which the I vector data can be collected for incorporation into, for example, a weighted moving average. The weighted moving average can be based on fixed and/or variable weights that can be specified by a user, for example. As provided previously herein, in some embodiments, the command vector can be of the same dimension as the gain amplifier output, Eg, and can include similar vector elements. For example, in accordance with a process system 12 that includes a lithography system or tool, a command vector may include at least one control associated with at least one of an x-translation error, a y-translation error, an x-scaling error, a y-scaling error, a wafer rotation error, a non-orthogonality error, an asymmetric magnification error, an asymmetry rotation error, a reticle rotation error, a reticle magnification error, a critical dimension (CD), linewidth error or bias, an exposure dose error or bias, a reticle density, a mask density, a frame-to-frame alignment, a distance from optical center to frame center, an alignment mark line size, an alignment mark density, and an alignment mark duty cycle, although such examples are provided for illustration and not limitation.

The illustrated event database 28 can employ a commercially available database (e.g., SQL, Informix, Oracle, Access, etc.) or another system for associating data and allowing such associated data to be queried and/or retrieved according to the methods and systems disclosed herein. In an embodiment where the process system 12 includes a lithography system, the event database 28 can be arranged to associate data based on, for example, process system characteristics and/or other correlation keys that can include a technology identifier (e.g., type of processor, operating system, etc.), a reticle identifier, a route identifier, an operation identifier, a process level identifier, an exposure tool identifier, and/or a part number, although such examples are merely illustrative, and some embodiments can use fewer and/or more identifiers or process system characteristics.

The correlator module 26 can thus also include or otherwise provide for rules for querying the event database 28. In an embodiment, a user and/or system administrator can provide default query rules that can be modified using, for example, an interface such as a graphical user interface (GUI). For example, a user may provide the correlator module 26 with a hierarchy of query criteria and filter criteria such that one or more correlation keys or query criteria can be eliminated from the query or otherwise presented as a wildcard in the query if the filtered query results are not sufficient. Accordingly, query results can be filtered based on default and/or user-specified criteria that can include, for example, a minimum number of query results, a maximum number of query results, a time period within which the data may have been collected, and/or a type of weighting average to apply. In an embodiment, if the filtered query results are inadequate to allow for a computation of the control/command vector, $C_{FB}$, the disclosed methods and systems can allow for a wildcarding of system parameters based on a user's hierarchical wildcarding configuration. Such a system can thus perform several feedback requests or database queries and filterings before obtaining query results sufficient for computing $C_{FB}$.

In one example, a user may query the event database 28 based on process system characteristics that include a technology identifier (ID), a routing identifier (ID), a process level identifier (ID), an operation identifier (ID), a device (or part number) identifier (ID), a reticle identifier (ID), an exposure tool identifier (ID), and/or another process and/or measurement system characteristic. The query may further specify or it may otherwise be known that data satisfying such process system characteristics be within a time period in the last M weeks, and further, at least N data points be collected for a valid retrieval. Because the criteria for N data points within the past M weeks may not be satisfied in an initial query, the user may decide to wildcard, for example, the exposure tool ID criteria to potentially allow further data points (i.e., satisfying the query regarding process system characteristics other than exposure tool ID). If N data points with M weeks are not retrieved after querying without employing exposure tool ID, the user may specify that the next process system criteria to be eliminated from the query may be reticle ID. Those of ordinary skill in the art will recognize this example as providing an illustration of the aforementioned hierarchical wildcarding, where query terms and/or correlation keys can be specified as employing an exact match (e.g., Windows 2000 operating system), a partial wildcard (e.g., a Windows operating system), or a complete wildcard (e.g., operating system not relevant). As provided herein, the user can additionally and optionally establish a hierarchical rule for invoking the wildcards (e.g., in the example herein, exposure tool ID was ranked as the first parameter to wildcard, followed by reticle ID, etc.).

In some cases, the wildcarding process may not provide sufficient query results for allowing a computation of $C_{FB}$. In an embodiment, a user or another can be alerted or otherwise informed when $C_{FB}$ cannot be computed because of insufficient query results, and such condition may require a manual adjustment to a system according to FIG. 1.

As illustrated in FIG. 1, some embodiments can allow a user or another to provide a manual input (e.g., user-specified input) to override or otherwise compensate the command vector, $C_{FB}$. Accordingly, a system based on the illustrated control system 30 can include one or more processor-controlled devices that can interface to the process system 12 and the measurement system 14, where a user, system administrator, or another, referred to throughout herein collectively as a user, can access data at various stages of the control system 30 via a user interface (e.g., GUI, operating system prompt) and utilize one or more peripheral devices (e.g., memory, keyboard, stylus, speaker/voice, touchpad, etc.) to provide input or otherwise alter data at various stages of the control system 30. A user can also utilize tools that can be incorporated into or otherwise interface with the control system 30 to analyze or otherwise view data at various stages of the control system 30, where such analysis can be performed in real-time and/or off-line. Accordingly, changes to the components of such a control system 30 can be performed in real-time and/or off-line.

Those of ordinary skill in the art will recognize that in an example where the FIG. 1 process system 12 can be a lithographic system and the measurement system 14 can be an exposure measurement tool, the lithographic system 12 can be configured by a user to query for data from the correlator module 26 and/or event database 28 to provide an initial command vector, $C_{FB}$, where such query can also include or otherwise be based on process system characteristics, hierarchical rules, wildcarding, and/or other criteria. Based on the filtered query results, a $C_{FB}$ can be provided for an initial wafer. If a $C_{FB}$ cannot be computed based on a lack of filtered query results, systems and methods according to FIG. 1 may cause a "send-ahead" wafer to allow processing and measurements upon which control can be provided. Using send-ahead wafers and other such techniques can be costly and can adversely affect the throughput of the methods and systems. As provided herein, to reduce the occurrences of ineffective queries and hence "send-ahead" wafers, users may devise a query that wildcards enough process system characteristics to obtain a desired number of query results to provide an initial $C_{FB}$, but such wildcarding techniques can cause incompatible data (e.g., based on different process system characteristics from that presently occurring in the process system 12) to be included in the $C_{FB}$ computation, and hence be ineffective in providing the desired control. For example, a user can wildcard reticle ID, thus allowing the query to combine (e.g., compute a weighted moving average) based on different reticle IDs. In this example, because different reticles have different reticle errors, such errors remain uncompensated, and hence can combine in undesirable manners to induce undesirable system performance, particularly when the process system 12 is presently utilizing or otherwise affected by a specific reticle.

As provided herein, the disclosed methods and systems relate to controlling CD error based on a control of dose error, which may be one control provided in the feedback command, $C_{FB}$. Those of ordinary skill thus recognize that CD error can be associated with exposure dose error, where exposure dose error for a system according to FIG. 1 can be computed based on Equation (1), and with relation thereto, a user or another can provide a Target CD, and the Measured CD can be provided by the raw data analysis 16. Accordingly, because the difference between Target and Measured CD has units of, for example, micrometers, and Dose Sensitivity has units of (micrometers/dose-unit), the exposure dose error component of $E_G$ can have units of dose-units. Similarly, the I, A, and $C_{FB}$ exposure dose error components also have units of dose-units. For a method and system according to FIG. 1, regardless of the system parameters (e.g., photomask ID, exposure tool ID, etc.), the exposure dose error component can have units of dose-units, and thus be combined (e.g., weighted moving average) without regard for differences in the system parameters. Such a CD control system can be known herein as an isomorphic system and method.

Figure 2:
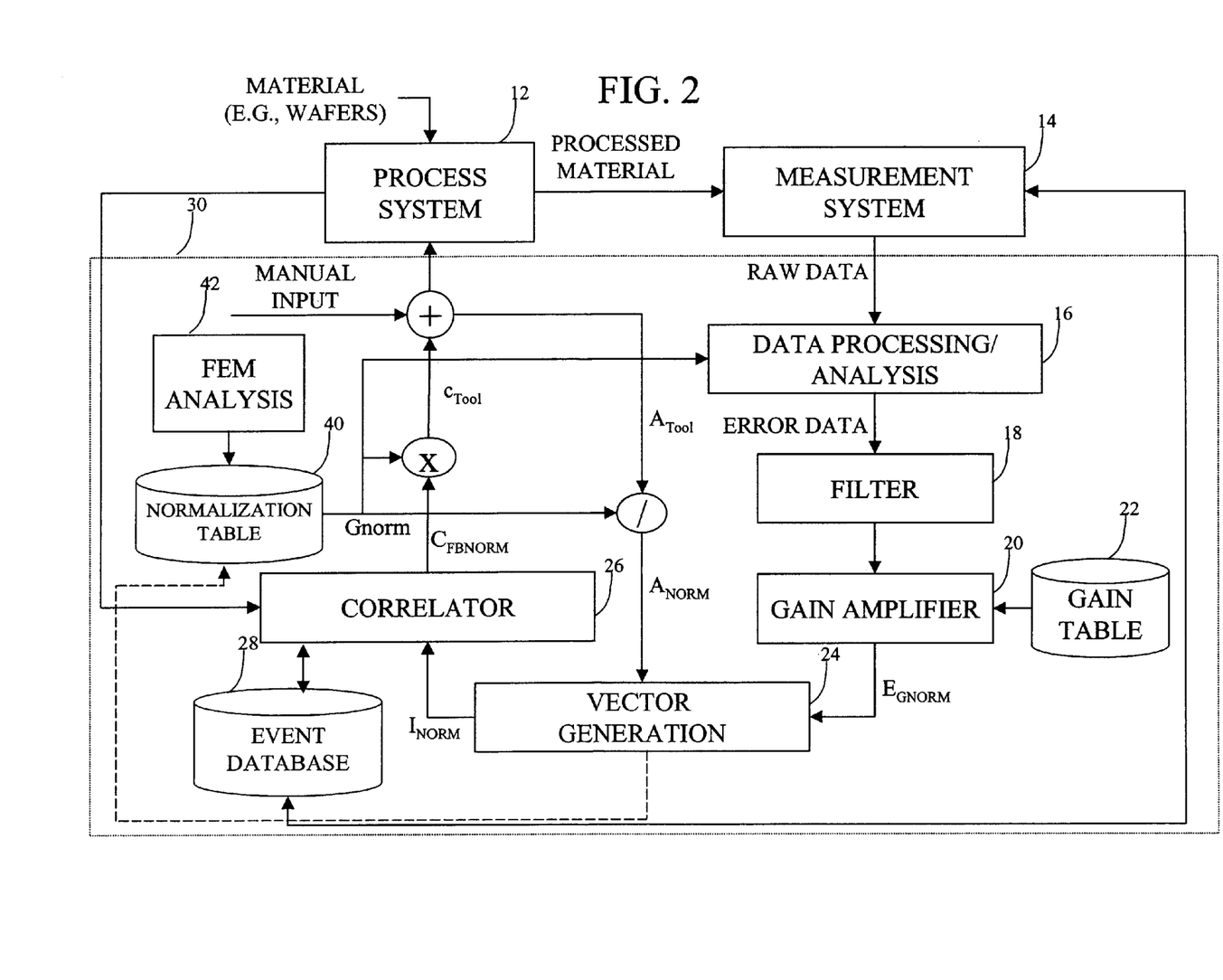
FIG. 2 is an exemplary control system using CD normalization.

FIG. 2 provides a method and system for controlling CD error through normalization by providing a normalization table 40 that associates a process system and/or measurement system characteristic such as a photomask and/or exposure tool, to a best-known exposure dose (e.g., "target exposure dose" or "target dose") based on such system parameters, and although the FIG. 2 normalization table 40 may associate a best-known exposure dose with a photomask and/or an exposure tool, those of ordinary skill will recognize that other process system parameters can be associated with a best-known exposure dose. A best-known exposure dose can be understood herein to be associated with an exposure dose that provides a desired and/or target CD error. A best-known exposure dose, otherwise designated herein as a target dose and represented as $G_{NORM}$, can accordingly be provided to the normalization table 40 manually (e.g., via a user interface or another means for providing data from a user, system administrator, etc.), automatically through test and other data, and/or through the use of Focus and Exposure Matrix (FEM) analysis that can determine a desired focus (e.g., x-axis of matrix) and/or exposure (e.g., y-axis of matrix) based on a given set of operating (e.g., process system 12) conditions. In some embodiments, for example, $G_{NORM}$ can be associated with a target CD for a given process system and/or measurement system characteristic, including for example, a photomask and/or exposure tool.

FIG. 2 can thus be understood relative to FIG. 1 with like components labeled accordingly, where the E, I, A, and other vectors from FIG. 1 can be discussed relative to FIG. 2 as having a single element related to exposure dose and/or exposure dose error. It can be understood that such explanation is merely for convenience, and as provided herein, such vectors can have multiple components that may or may not otherwise be related to exposure dose error. Further, such vectors are shown to have a subscript of "norm" as provided in FIG. 2 to indicate a normalized dose error that can be also be associated with a unitless value.

As FIG. 2 indicates, the data analysis module 16 can utilize $G_{NORM}$ to compute a normalized exposure dose error according to Equation (2):

$$E_{NORM}=((\text{Measured\_CD}-\text{Target\_CD})/\text{DoseSensitivity})/G_{NORM} \quad (2)$$

The measured critical dimension, or Measured_CD, can be generated using a variety of measurement techniques and systems, and the disclosed methods and systems are not limited to one or more such techniques. Further, the target critical dimension, or Target_CD, can be provided by a user, manufacturer, or another via a user interface or another means for inputting data. The comparison between measured CD and target CD, represented in Equation (2) as a difference measure, can thus be more generally referred to as a computation of critical dimension error, and Equation (2) thus provides one basis for computing such an error, and other methods for computing the same can be used without departing from the scope of the disclosed methods and systems. Further, the use of an exposure dose sensitivity in Equation (2) thus illustrates one conversion of CD error to an exposure dose error, and other conversion methods can be used. Those of ordinary skill will thus understand that the value and/or data for $G_{NORM}$ can be provided by a query of the illustrated normalization table 40, where the query can be based on the process system and/or measurement system characteristics. Accordingly, based on, for example, a photomask and/or exposure tool associated with the process system 12, $G_{NORM}$ can be provided to normalize the exposure dose error based on such system characteristics, such that $E_{NORM}$ is unitless. Further, as will be provided herein, the ideal or I-Vector generation module 24 can compute differences between normalized error vectors, $E_{NORM}$, and normalized actual or A-vectors, $A_{NORM}$ (i.e., actual exposure doses provided to the process system), to compute normalized feedback commands, $C_{FBNORM}$, where in one embodiment, $C_{FBNORM}$ can be computed according to Equation (3):

$$C_{FBNORM} = \Sigma(I_{NORM} * wma) \quad (3)$$

As provided previously herein with respect to FIG. 1 and in accordance with Equation (3), in one embodiment, the correlator 26 can compute $C_{FBNORM}$ by querying the event database to retrieve $I_{NORM}$ data (and/or $E_{NORM}$ and/or $A_{NORM}$ data), and base such computation on a combination of such ideal vectors, where such combination can be a weighted moving average (wma) of the retrieved $I_{NORM}$ data, as provided by Equation (3). Those of ordinary skill in the art will recognize that other combinations of $I_{NORM}$ data can be implemented (e.g., average, filtered, etc.) $C_{FBNORM}$ is thus also unitless, and as described relative to FIG. 1, the correlator 26 query to compute and/or retrieve $I_{NORM}$ data can be based on process system and/or measurement system characteristics and can utilize wildcarding and/or hierarchical retrieval schemes and/or rules that may be provided by a user or another.

In one embodiment of a system and method according to FIG. 2, an exposure dose can be provided as feedback to the process system 12, and accordingly, $C_{FBNORM}$ can be re-scaled and/or otherwise converted from an exposure dose error to provide an exposure dose, in dose-units, to the process system, based on retrieving a target dose from the normalization table 40. Those of ordinary skill will recognize that, notwithstanding FIG. 2, the retrieved target dose to convert $C_{FBNORM}$ (exposure dose error) to $C_{TOOL}$ (exposure dose) may or may not be the same retrieved target dose $G_{NORM}$, as retrieved by the data processing module 16 for normalizing the measured exposure dose error.

Returning to FIG. 2, for an embodiment that provides the process system 12 with an exposure dose to control exposure dose error, the exposure dose, $C_{TOOL}$, can be computed according to Equation (4):

$$C_{TOOL} = G_{NORM} * (1 + C_{FBNORM}) \quad (4)$$

In such an embodiment, one of ordinary skill will also recognize that the actual process system 12 or tool exposure dose, $A_{TOOL}$, can also be normalized as provided in FIG. 2, and as expressed by Equation (5), to facilitate normalized I-vector computations:

$$A_{NORM} = (A_{TOOL}/G_{NORM}) - 1 \quad (5)$$

One of ordinary skill will understand that implicit in FIG. 2 can be a query of the normalization table to retrieve a value for $G_{NORM}$ for use in a computation according to Equation (5). Accordingly, FIG. 2 indicates that at least three queries of the normalization table may be made as provided herein and associated with Equations (2), (4), and (5), and further, such queries may provide the same or different query results.

A system according to FIG. 2 can also employ an automated and/or automatic updating of the normalization table 40 by providing normalized I vector data to the normalization table 40. For example, the normalized I vector exposure error data can be input to the table 40 based on process system and/or measurement system characteristics such as, for example, photomask and/or exposure tool, and the table 40 can be equipped with and/or otherwise be associated with filtering, learning, and/or correlation schemes and/or modules to allow for a table (e.g., database) 40 entry (e.g., target exposure dose) to be updated based on new (e.g., normalized dose error) data. Those of ordinary skill will thus understand that such updating can include a conversion of the unitless exposure dose error data to exposure dose units, as the target exposure doses are provided in exposure dose units. Also, as provided previously herein relative to FIG. 1, such filtering, etc., of the normalized I vector data can be based on process system 12 and/or measurement system 14 characteristics and/or other data that may indicate, for example, that the new data may not be robust, not associated with a previously identified photomask and/or exposure tool ID, etc.

In one embodiment, a user, system administrator, or another can provide a default $G_{NORM}$ that can be employed by the normalization table 40 in certain situations (e.g. there is no normalization table data for or otherwise associated with a given query (e.g., photomask and/or exposure tool)). In some embodiments, a default $G_{NORM}$ can vary based on process system and/or measurement system characteristics and/or other criteria provided by a user or another. Accordingly, it can be understood herein that an embodiment that includes a default $G_{NORM}$ can thereby associate such default $G_{NORM}$ with a process system and/or measurement system characteristic for such process systems that do not otherwise have a process system and/or measurement system characteristic associated with a non-default $G_{NORM}$.

Figure 3:
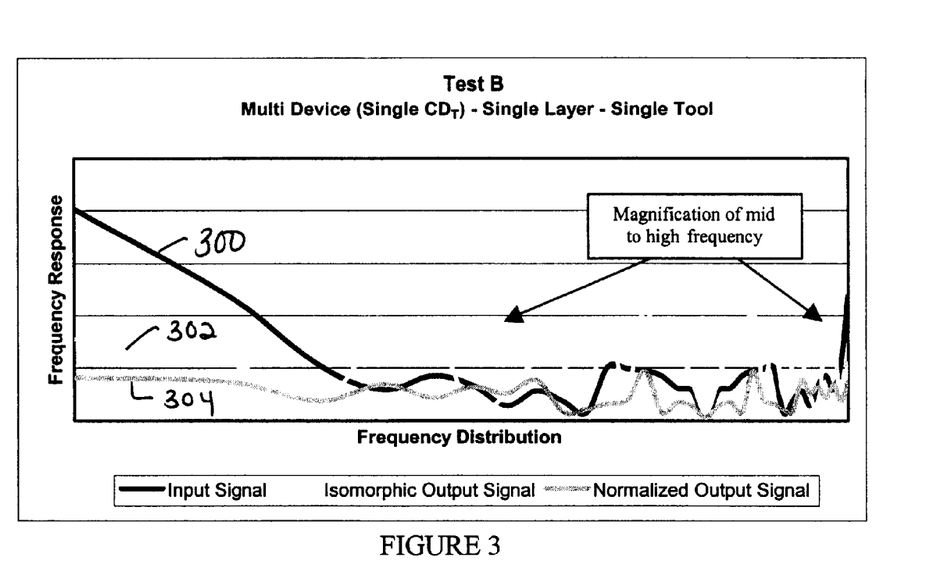
FIGS. 3–7 present frequency representations comparing exposure,dose error for uncontrolled, isomorphic, and normalized systems.

In a first example ("Test B") of the methods and systems according to FIG. 2, queries of the event database 28 were performed to allow combinations of data having multiple photomask IDs having the same target CD, while constraining the retrieved data to a single process level and a single exposure tool. The queries were employed with systems based on FIGS. 1 ("isomorphic") and 2 ("normalized"), and the corresponding results compared with an uncontrolled process using a frequency response graph as shown in FIG. 3 that graphs frequency characteristics of the exposure dose error for the three systems. Those of ordinary skill will recognize that advanced process control (APC) systems as provided herein cannot generally control frequencies above the sampling frequency of a given process stream, arid accordingly, such frequencies are termed herein as "mid" and "high" frequencies. APC systems thus attempt to control low frequency variations (e.g., frequencies less than the sampling frequency) without magnifying the mid and high frequencies.

As FIG. 3 indicates, the isomorphic 302 and normalized 304 systems reduced the low frequency variations of the exposure dose error when compared to the uncontrolled system 300, however the isomorphic system 302 increased the mid and high frequency variations when compared to the uncontrolled 300 and normalized 304 systems. The isomorphic system 302 thus caused an approximate twenty-nine percent increase in exposure dose error when compared to the uncontrolled system 300, while the normalized system 304 decreased exposure dose error by approximately forty-eight percent when compared to the uncontrolled system 300.

Figure 4:
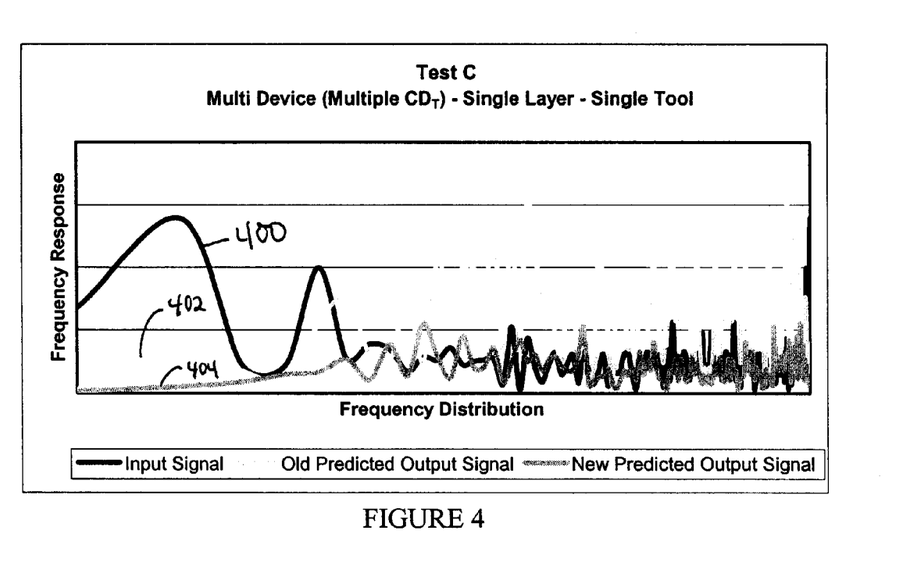

In a second example ("Test C"), rather than querying for multiple photomask IDs with the same target CD as in Test B, the query was allowed to retrieve data for different target CDs. FIG. 4 provides a frequency response graph for the exposure dose error(s) of an uncontrolled 400, isomorphic 402, and normalized 404 system as provided herein. As FIG. 4 indicates, the isomorphic 402 and normalized 404 systems reduce the low frequency variations when compared to the uncontrolled system 400; however, the isomorphic system 402 also exacerbates the mid and high level frequency variations when compared to the uncontrolled 400 and normalized 404 systems. Accordingly, the isomorphic system 402 provides an approximate one-hundred percent decrease in overall exposure dose error, while the normalized system 404 presents an approximate thirty-two percent improvement.

Figure 5:
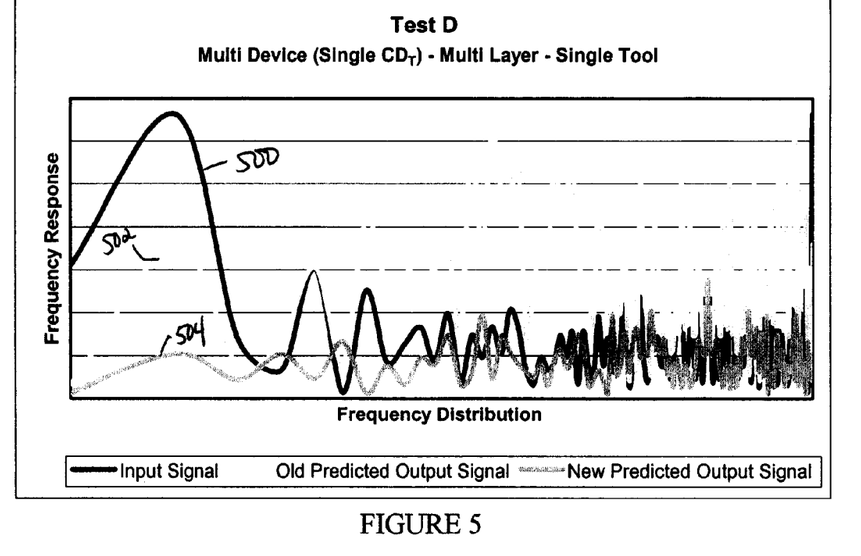

FIG. 5 displays the frequency response characteristics for exposure dose error for a third example ("Test D") that can be a variation of Test B in that multiple process levels with the same target CD are allowed to be retrieved. Once again, the isomorphic 502 and normalized 504 systems provide a reduction in low frequency variation when compared to the uncontrolled system 500, and the isomorphic system 502 causes greater mid and high frequency variations when compared to the uncontrolled 500 and normalized 504 systems. Accordingly, the overall performance indicates an increase in exposure dose error of approximately one-hundred and one percent for the isomorphic system 502, and a decrease in exposure dose error of approximately thirty-eight percent for the normalized system 504 when compared respectively to the uncontrolled system 500.

Figure 6:
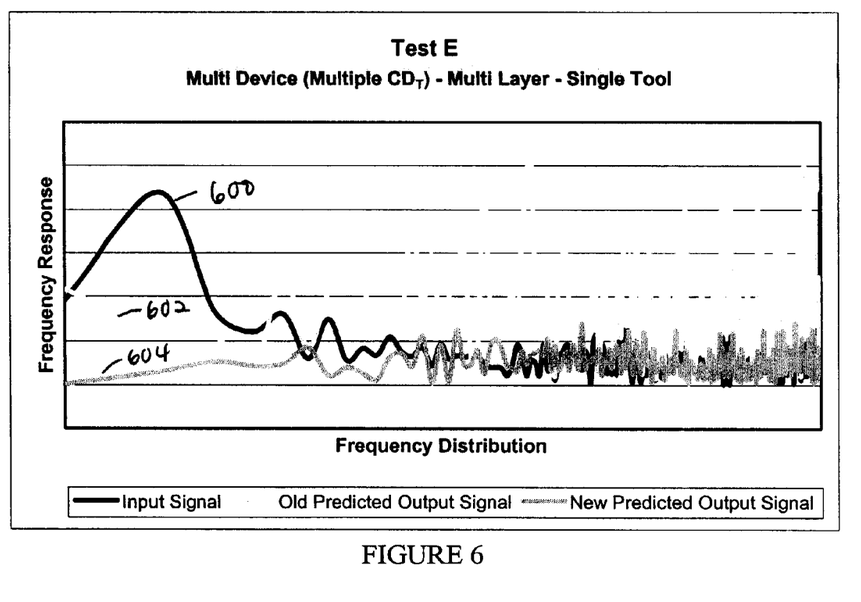

FIG. 6 displays exposure dose error frequency response characteristics for an uncontrolled system 600, an isomorphic system 602, and a normalized system 604 for a fourth example ("Test E") that expands a data population to include multiple photomask IDs with different target CDs from multiple but similar process levels, while constraining the data population to a single exposure tool. As FIG. 6 indicates, the same trends as provided in FIGS. 3 through 5 are repeated, with generally decreased performance for the isomorphic 602 and normalized 604 systems when compared to FIGS. 3 through 5. Generally, the FIG. 6 isomorphic data 602 indicates an increase in exposure dose error on the order of one-hundred thirty-four percent when compared to the uncontrolled system 600, contrasted with a twenty-eight percent decrease in exposure dose error for the normalized system 604 when compared to the uncontrolled system data 600.

Figure 7:
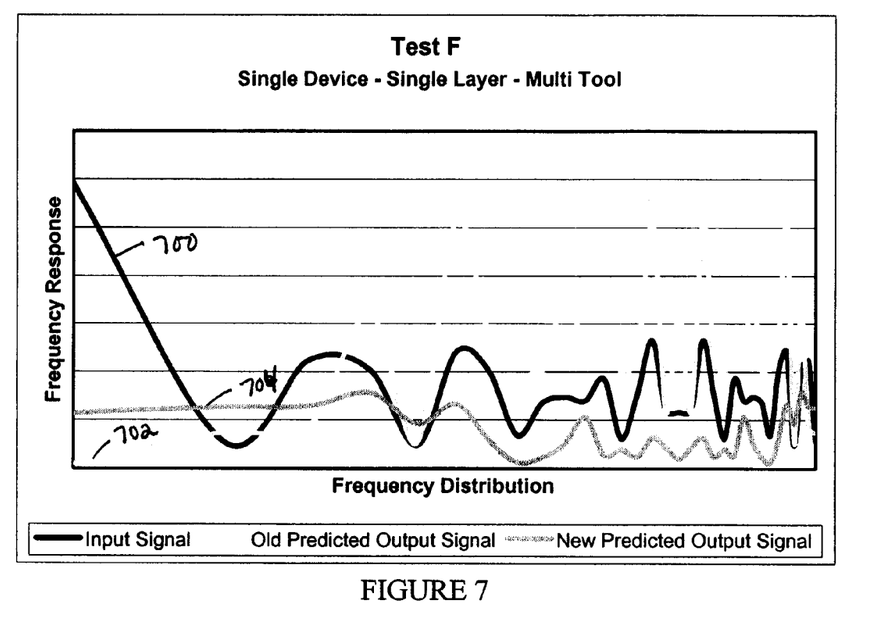

The frequency response data for exposure dose error presented in FIG. 7 ("Test F") relate to a query that allowed multiple exposure tools for a single photomask ID and single process level. The trends of FIGS. 3–6 are again evident, with the isomorphic system 702 providing an overall approximate fifty-percent increase in exposure dose error when compared with the uncontrolled system 700, while the normalized system decreased exposure dose error by approximately fifty-two percent when compared to the uncontrolled system 700.

What has thus been described are methods and systems for controlling exposure dose error, and hence critical dimension error (CD error) by normalizing measured exposure dose error data based on a best-known or target exposure dose associated with a process system and/or measurement system characteristic. For example, the target dose can be associated with a process level, a photomask, an exposure tool, and/or other process system and/or measurement system characteristic. The target dose can be manually provided, updated based on process system data, and/or based on FEM analysis.

The methods and systems described herein are not limited to a particular hardware or software configuration, and may find applicability in many computing or processing environments. The methods and systems can be implemented in hardware or software, or a combination of hardware and software. The methods and systems can be implemented in one or more computer programs, where a computer program can be understood to include one or more processor executable instructions. The computer program(s) can execute on one or more programmable processors, and can be stored on one or more storage medium readable by the processor (including volatile and non-volatile memory and/or storage elements), one or more input devices, and/or one or more output devices. The processor thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) can be implemented using one or more high level procedural or object-oriented programming languages to communicate with a computer system; however, the program(s) can be implemented in assembly or machine language, if desired. The language can be compiled or interpreted.

As provided herein, the processor(s) can thus be embedded in one or more devices that can be operated independently or together in a networked environment, where the network can include, for example, a Local Area Network (LAN), wide area network (WAN), and/or can include an intranet and/or the internet and/or another network. The network(s) can be wired or wireless or a combination thereof and can use one or more communications protocols to facilitate communications between the different processors. The processors can be configured for distributed processing and can utilize, in some embodiments, a client-server model as needed. Accordingly, the methods and systems can utilize multiple processors and/or processor devices, and the processor instructions can be divided amongst such single or multiple processor/devices.

The device(s) or computer systems that integrate with the processor(s) can include, for example, a personal computer(s), workstation (e.g., Sun, HP), personal digital assistant (PDA), handheld device such as cellular telephone, laptop, handheld, or another device capable of being integrated with a processor(s) that can operate as provided herein. Accordingly, the devices provided herein are not exhaustive and are provided for illustration and not limitation.

References to "a processor" or "the processor" can be understood to: include one or more processors that can communicate in a stand-alone and/or a distributed environment(s), and can thus can be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network using a variety of communications protocols, and unless otherwise specified, can be arranged to include a combination of external and internal memory devices, where such memory can be contiguous and/or partitioned based on the application. Accordingly, references to a database can be understood to include one or more memory associations, where such references can include commercially available database products (e.g., SQL, Informix, Oracle) and also proprietary databases, and may also include other structures for associating memory such as links, queues, graphs, trees, with such structures provided for illustration and not limitation.

Although the methods and systems have been described relative to a specific embodiment thereof, they are not so limited. Obviously many modifications and variations may become apparent in light of the above teachings. For example, as provided herein, the target CD and/or "best known" CD, otherwise provided herein as $G_{NORM}$, can be associated with one or more process system and/or measurement system characteristics such as process level, exposure tool, photomask, and others.

Many additional changes in the details, materials, and arrangement of parts, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

What is claimed is:

1. A method for controlling critical dimension (CD) in a process system, the method comprising:
   computing an exposure dose error based on at least one output of the process system,
   normalizing the computed exposure dose error based on a target exposure dose, and,
   providing an exposure dose to the process system based on at least one normalized exposure dose error.

2. A method according to claim 1, where normalizing includes at least one of:
   querying a normalization table, where the normalization table includes target doses, and,
   retrieving the target exposure dose from the normalization table.

3. A method according to claim 1, where normalizing includes retrieving the target exposure dose based on at least one of: at least one process system characteristic and at least one characteristic of a measurement system.

4. A method according to claim 1, where the target exposure dose is associated with at least one of a photomask, an exposure tool, and a process level.

5. A method according to claim 1, further comprising associating the computed exposure dose error with at least one of: at least one process system characteristic and at least one characteristic of a measurement system.

6. A method according to claim 1, further comprising associating the computed exposure dose error with at least one of a photomask, an exposure tool, and a process level.

7. A method according to claim 1, where computing an exposure dose error includes measuring a critical dimension based on at least one output of the process system.

8. A method according to claim 1, where computing an exposure dose error includes:
   providing a target critical dimension, and,
   generating a comparison between the target critical dimension and a measured critical dimension based on at least one output of the process system.

9. A method according to claim 1, where computing an exposure dose error includes computing a critical dimension error.

10. A method according to claim 9, where computing an exposure dose error includes converting the critical dimension error to an exposure dose error based on an exposure dose sensitivity.

11. A method according to claim 1, where providing an exposure dose includes combining at least two normalized exposure dose errors.

12. A method according to claim 1, where providing an exposure dose includes:
    computing a weighted moving average of normalized exposure dose errors, and,
    converting the weighted moving average to an exposure dose, where the converting is based on a target exposure dose.

13. A method according to claim 12, where converting includes converting based on the target exposure dose employed to normalize the exposure dose error.

14. A method according to claim 1, further comprising associating the measured normalized exposure dose error with a target exposure dose.

15. A method according to claim 1, further comprising using the measured normalized exposure dose error to update at least one target exposure dose.

16. A method according to claim 1, where providing an exposure dose includes:
    generating an ideal exposure dose error based on the normalized exposure dose error and an exposure dose previously provided to the process system, and,
    computing an exposure dose based on at least one ideal exposure dose error.

17. A method according to claim 16, where generating includes normalizing the exposure dose previously provided to the process system, where the normalization is based on a target exposure dose.

18. A method according to claim 17, further comprising retrieving the target exposure dose based on a query, where the query is based on the at least one of: at least one process system characteristic and at least one characteristic of a measurement system.

19. A method according to claim 16, where computing includes combining at least one ideal exposure dose error.

20. A method according to claim 16, where computing includes computing a weighted moving average of at least two ideal exposure dose errors.

21. A method according to claim 1, further including providing a normalization table to associate the target exposure dose with at least one of: at least one process system characteristic and at least one characteristic of a measurement system.

22. A method according to claim 1, where the normalization table is associated with at least one of: at least one learning module, at least one filter, and at least one averaging module.

23. A method according to claim 1, further comprising updating the target exposure dose based on at least one normalized exposure dose error.

24. A method according to claim 1, where the target exposure dose is an updated target exposure dose based on at least one of: at least one normalized exposure dose error, at least one initial target exposure dose, and at least one default target dose.

25. A method according to claim 1, where the target exposure dose is based on at least one of:
- a target critical dimension,
- a manually entered exposure dose,
- a focus and exposure matrix (FEM) associated with the process system, and
- at least one normalized exposure dose error.

26. A method according to claim 1, where providing an exposure dose includes:
- querying a normalization table based on at least one of: at least one process system characteristic and at least one characteristic of a measurement system, and,
- based on the query results and at least one normalized exposure dose error, computing an exposure dose.

27. A method according to claim 1, where normalizing includes employing at least one default target exposure dose.

28. A method according to claim 1, where normalizing includes associating at least one default target exposure dose with at least one of: at least one process system characteristic and at least one characteristic of a measurement system.

29. A method according to claim 1, where the process system includes at least one of a lithography system and a microlithography system.

30. A method according to claim 1, where measuring a measured exposure dose error includes providing at least one least square regression model associated with the process system.

31. A system for controlling critical dimension (CD) in a process system, the system comprising:
- a measurement system to provide at least one measurement associated with at least one process system error, and,
- a control system to provide an exposure dose to the process system, where the exposure dose is based on at least one normalized exposure dose error, where the normalized exposure dose error is based on a target exposure dose associated with at least one of: at least one process system characteristic and at least one measurement system characteristic.

32. A system according to claim 31, further comprising a normalization table to associate the target exposure dose with at least one of: at least one process system characteristic and at least one measurement system characteristic.

33. A system according to claim 31, where the at least one process system characteristic and the at least one measurement system characteristic includes at least one of a photomask, an exposure tool, and a process level.

34. A system according to claim 31, where the control system includes instructions to cause a processor to compute a critical dimension (CD) error based on at least one output of the process system.

35. A system according to claim 34, where the CD error is based on a comparison of a measured CD and a target CD, where the measured CD is based on the at least one output, of the process system.

36. A system according to claim 31, where the control system includes instructions to cause a processor to normalize a computed critical dimension (CD) error based on a target exposure dose.

37. A system according to claim 31, where the control system includes instructions to provide a target exposure dose based on at least one of: at least one manual entry, at least one normalized exposure dose error, and data based on at least one focus and exposure matrix (FEM).

38. A system according to claim 31, where the control system includes instructions to cause a processor to retrieve the target exposure dose based on a query of a normalization table, where the normalization table associates the target exposure dose with at least one of: at least one process system characteristic and at least one characteristic of a measurement system.

39. A system according to claim 31, where the measurement system includes at least one of an exposure tool and a critical dimension measurement tool.

40. A system according to claim 31, where the process system is at least one of a lithography system and a microlithography system.

41. A system according to claim 31, where the process system is at least one of: a lithography, a chemical mechanical polish (CMP), a diffusion, thin film, a metal deposition, an ion implantation, and an etching system.

42. A system according to claim 31, where the control system includes instructions to cause a processor to update a target exposure dose using at least one normalized exposure dose error and at least one: at least one learning module, at least one filter, and at least one averaging module.

43. A system according to claim 41, where the updated target exposure dose is stored in a normalization table.

* * * * *